United States Patent [19]

Okada et al.

[11] 4,200,836
[45] Apr. 29, 1980

[54] APPARATUS FOR MEASURING INSULATION RESISTANCE IN AN OPERATING THREE-PHASE UNGROUNDED TRANSMISSION LINE SYSTEM

[75] Inventors: Isamu Okada; Takehito Inoue, both of Kawasaki, Japan

[73] Assignee: Fuji Electric Co., Ltd., Tokyo, Japan

[21] Appl. No.: 915,240

[22] Filed: Jun. 13, 1978

[51] Int. Cl.$^2$ .................. G01R 27/16; G01R 31/02
[52] U.S. Cl. .................................. 324/51; 324/54; 324/62; 340/650
[58] Field of Search .................. 324/51, 54, 62; 340/647, 650, 651

[56] References Cited

U.S. PATENT DOCUMENTS

| | | | |
|---|---|---|---|
| 2,923,879 | 2/1960 | Povey | 324/54 |
| 3,678,376 | 7/1972 | Jaster et al. | 324/54 |
| 3,710,238 | 1/1973 | Peterson | 340/650 X |
| 3,774,106 | 11/1973 | MacPhee | 324/51 |
| 3,842,344 | 10/1974 | Povey | 324/54 |
| 3,866,117 | 2/1975 | Erdman | 324/54 |
| 3,891,895 | 6/1975 | Wittlinger | 324/51 X |
| 3,971,007 | 7/1976 | Borkovitz et al. | 324/51 X |
| 3,978,465 | 8/1976 | Goode | 324/51 X |
| 4,066,950 | 1/1978 | Rumold et al. | 324/51 |
| 4,112,354 | 9/1978 | Bahder et al. | 324/54 |

Primary Examiner—Gerard R. Strecker
Attorney, Agent, or Firm—Bruce L. Birchard

[57] ABSTRACT

By introducing into an operating 3-phase transmission line system through a transformer having the common point of its "Y" or "star" connected primary grounded and its ungrounded secondary coupled in open "delta" configuration to a source of a measurement voltage having a second frequency significantly lower than the first or operating frequency of the transmission line system, detecting the current flowing in the transmission line system at the second frequency and multiplying the measurement voltage injected into the transmission line by the measurement current produced thereby, a d.c. component is obtained which is representative of the insulation resistance's magnitude, permitting calibration of the apparatus in terms of insulation resistance. At the same time a fault alarm system may operate with part of its circuit in common with the circuit of the resistance measuring apparatus.

8 Claims, 3 Drawing Figures

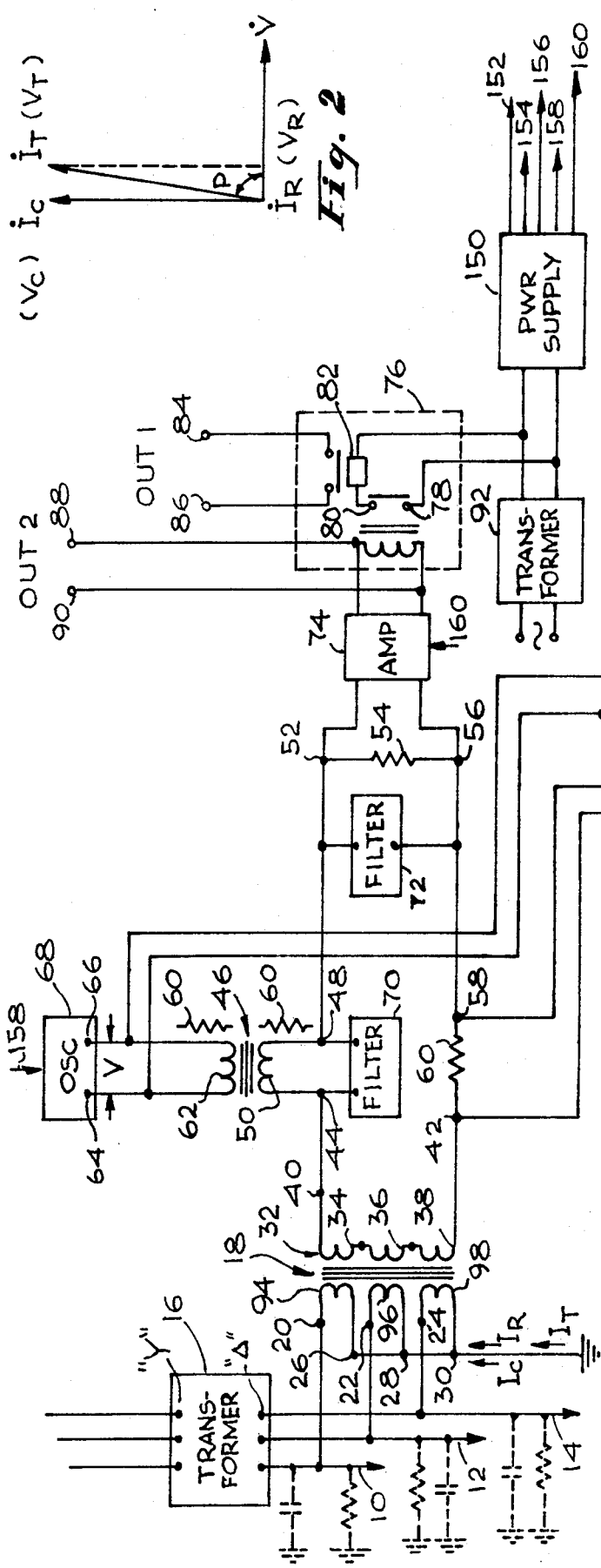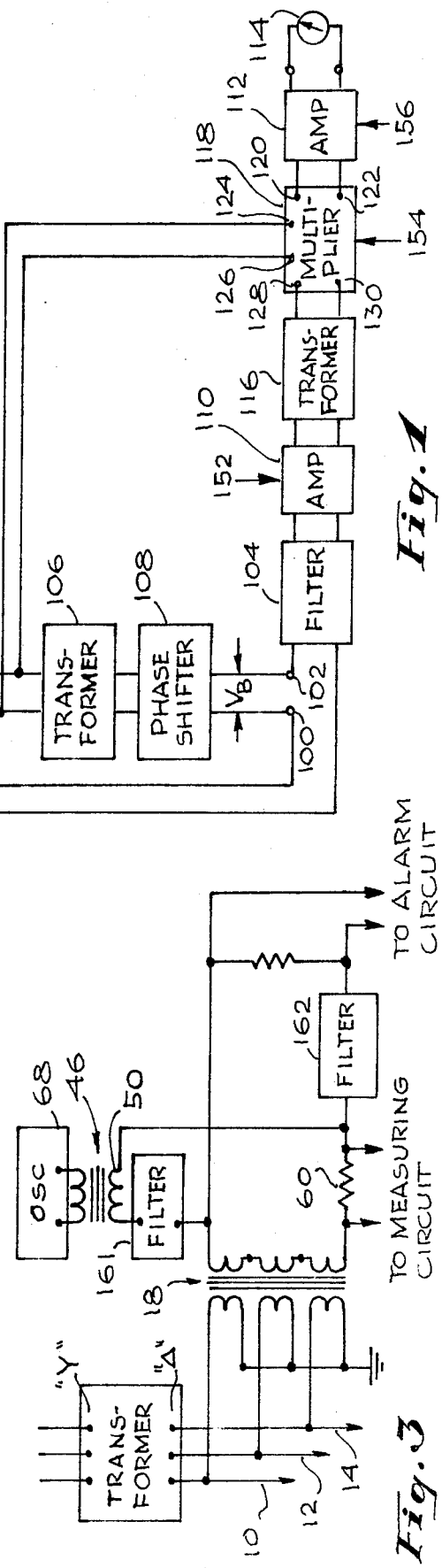

APPARATUS FOR MEASURING INSULATION RESISTANCE IN AN OPERATING THREE-PHASE UNGROUNDED TRANSMISSION LINE SYSTEM

RELEVANT CO-PENDING APPLICATION

Co-pending application Ser. No. 910,960 relates to apparatus for measuring the insulation resistance of a grounded transmission line system.

BACKGROUND OF THE INVENTION

1. Field of the Invention

This invention relates to insulation resistance measuring apparatus for power transmission systems.

2. Prior Art

In the past, insulation resistance has been measured with high voltage, low current generators connected to non-operating power lines. It has not been possible to measure the insulation resistance with the power line "hot", i.e., operational. Further, inherent high distributed capacitance in power line systems defeats the prior art insulation resistance measuring apparatus. Additionally, in prior art systems it has not been possible to combine insulation resistance measuring apparatus with ground-fault alarm systems.

SUMMARY OF THE INVENTION

It is one object of the present invention to provide insulation resistance measuring apparatus which is free of the various shortcomings recited hereinbefore.

It is a further object of this invention to provide insulation resistance measuring apparatus which can cooperate with fault alarms in transmission line systems.

It is a still further object of this invention to provide insulation resistance measuring apparatus which can function in a "hot" three-phase, ungrounded transmission line system.

Stated succinctly, the foregoing objects are met by introducing in a three-phase power line system an alternating measurement voltage having a frequency which is low with respect to the frequency of the voltage normally found in the transmission lines. For example, in a 60 $H_z$ power transmission system a measurement voltage of 10 or 15 $H_z$ might be introduced. This wide frequency separation of the power voltage and the measurement voltage makes selective filtering of these voltages (and their accompanying currents) practicable.

The measurement voltage is introduced across the terminals of an open "delta" secondary winding of a pick-up transformer, the primary of which is "Y" or "star" connected with the common terminal grounded. The remaining terminal of each primary winding is connected to a respective one of the transmission lines being tested. A voltage corresponding to leakage resistance is developed across a dropping resistor on the secondary side of the pick-up transformer. That voltage is multiplied by the initial measurement voltage to give, in the output of the multiplier a signal with a d.c. component proportional to $V^2/R$ where V is the measurement voltage (held constant during the measurement) and R is the insulation resistance of the transmission lines. A meter may present this resistance in a direct reading fashion.

The inclusion of a phase-shifting network permits cancelling the component of the detected measurement current which has been produced by quadrature current flowing in the distributed capacitance at the frequency of the measurement voltage.

The insulation resistance measuring function may be combined with a line fault detector and alarm without adversely affecting the resistance measurement or the fault alarm functions.

BRIEF DESCRIPTION OF THE DRAWINGS

The invention can best be understood by referring to the discussion which follows taken in conjunction with the accompanying drawings, in which:

FIG. 1 is a combined schematic and block diagram of apparatus according to this invention;

FIG. 2 is a vector diagram of the relationship of certain currents utilized in the apparatus of this invention; and FIG. 3 is a partially schematic, partially block diagram showing a variarion of the insulation resistance measuring apparatus according to the present invention.

DETAILED DESCRIPTION OF THE PREFERRED EMBODIMENT

In FIG. 1, power lines 10, 12 and 14 are part of a 3-phase, ungrounded transmission line system fed from the "delta" connected secondary of transformer 16.

It is desired that their insulation or leakage resistance to ground be measured.

Measurement signal pick-up transformer 18 has its "Y" connected primary terminals 20, 22 and 24 connected to lines 10, 12 and 14, respectively. The remaining terminals 26, 28 and 30 are connected together and to ground.

Secondary 32 of transformer 18 has its respective windings 34, 36, and 38 connected in open "delta" configuration. Between closing terminals 40 and 42 of the "delta" secondary are connected the various components which make up the fault alarm system and the insulation resistance measuring apparatus.

Specifically, terminal 44 of transformer 46 is connected to closing terminal 40 of secondary 32. Terminal 48 of secondary 50 on transformer 46 is connected to terminal 52 of current limiting resistor 54, the other terminal 56 of which is connected to terminal 58 of measuring signal pick-up resistor 60. The remaining terminal of resistor 60 is connected to closing terminal 38.

The primary winding 62 of transformer 46 is coupled to the output terminals 64 and 66 of oscillator 68. Oscillator 68 generates a measurement signal at a frequency $F_2$ which is significantly below the frequency $F_1$ of the transmission line system. For example, $F_1$ may be 60 Hz., in which case $F_2$ will be 10 or 15 Hz. This frequency separation permits the desired selective filtering action by filters 70 and 72. Filter 70 shunts secondary 50 of transformer 46. Filter 70 presents a high impedance to current flow at frequency $F_2$ and a low impedance to current at frequency $F_1$. This is an L-C filter, the design of which can be found or derived from any standard electrical engineering handbook. The component values depend on the frequencies $F_1$ and $F_2$.

The filter 72 exhibits low impedance at frequency $F_2$ and high impedance at frequency $F_1$. Again it is a series-parallel resonant filter, the design of which is well known in the art.

The pick-up resistor 60 may appear in the primary or secondary leads of transformer 46, as indicated, as well at the point it is shown connected in FIG. 1.

When 3-phase lines 10, 12 and 14 are free of faults, the potential at frequency $F_1$ appearing between terminals 40 and 42 is nominally zero. Thus, no current at frequency $F_1$ flows through current limiting resistor 54. If, however, one or more of lines 10, 12, or 14 becomes grounded the system becomes unbalanced and a potential appears between terminals 40 and 42 and causes current to flow through resistor 54, producing a voltage drop therein which voltage drop is applied to isolation amplifier 74. Relay 76, having normally open contacts 78 and 80, is moved to a closed position by the voltage applied to it from amplifier 74. An alarm (not shown) attached to output terminals 84, 86 will be sounded, following an appropriate delay introduced by delay element 82.

An additional pair of terminals 88, 90 permits coupling the output of amplifier 74 to other indicator or alarm systems.

Power for relay 76 is provided from transformer 92. Thus, a fault alarm system is provided.

Turning to the insulation resistance measurement system portion of the circuit shown in FIG. 1, a single-phase measurement signal at frequency $F_2$, derived from oscillator 68, appears across open "delta" secondary winding 32 and consequently across the "Y" connected primary windings and, more specifically, between terminals 20, 22, 24 and ground.

Thus, a measurement signal at the relatively low frequency of $F_1$ is applied between transmission lines 10, 12, and 14 (which are carrying power at, say, 50 or 60 Hz. $F_2$), and ground. The distributed capacitance of lines 10, 12 and 14 to ground will result in a quadrature current $I_C$ flowing at $F_2$ in the primary windings 94, 96 and 98.

A corresponding quadrature current will appear in secondary winding 32 and will cause a voltage drop across pick-up resistor 60. That quadrature voltage may be canceled by adding a "bucking" voltage "$V_B$" between terminals 100 and 102 at the input to filter 104. Bucking voltage "$V_B$" is derived from oscillator 68 which is coupled through transformer 106 to phase-shifter 108. Phase shifter 108 may be a simple R-C circuit to obtain a 90° phase shift. The output of phase shifter 108 is made variable in amplitude, as by providing a potentiometer, so that the quadrature voltage appearing across pick-up resistor 60 is just canceled.

The resistance of the insulation between lines 10, 12, 14 and ground is normally several megohms, thus the current flow, in phase with the voltage appearing between terminals 64 and 66 of oscillator 68, through the circuit made up of secondary windings 34, 36 and 38, and resistor 60, filter 72 and winding 50 is limited by the impedance of that circuit and has a stand-by value which may be zeroed in its effect by adjusting the input signals at amplifiers 110 and 112 and by mechanically zeroing, or electrically zeroing (as by a counter-voltage equal but opposite to the static voltage) meter 114.

If the insulation resistance between any of lines 10, 12 and/or 14 and ground becomes abnormally low, a low impedance is reflected into secondary windings 34, 36 and/or 38 increasing the flow of current (at measuring-current frequency $F_2$) through the circuit including pick-up resistor 60. An increased voltage drop appears across resistor 60 at $F_2$ and at $F_1$.

Looking at the matter another way, lowering of insulation resistance between lines 10, 12 and/or 14 and ground results in an increase in $I_R$ in primary 94, 96 and/or 98. A corresponding voltage and current is induced in the respective one of secondary windings 34, 36 and 38, the current at $F_2$ (and $F_1$) through resistor 60 is increased, producing a greater voltage drop thereacross. That greater voltage drop at frequency $F_2$ causes an indication of insulation resistance on meter 114, by the method described hereinafter.

The current components $I_C$ and $I_R$ flowing in primary windings 94, 96 and 98 produces across pick-up resistor 60 a voltage drop at both frequencies $F_1$ and $F_2$. Because the voltage drop resulting at frequency $F_1$ is of no interest in this measuring apparatus and signals at that frequency are eliminated by low-pass, high-cut filter 104 (and L-C filter of conventional design), we will look only at the components of the voltage drop $V_T$ at frequency $F_2$ as it appears across resistor 60.

The current $I_T$ and voltage $V_T$ associated with resistor 60 at frequency $F_2$ are made up largely of quadrature components as a result of the large distributed capacitance between lines 10, 12 and 14, and ground. That fact is shown vectorially in FIG. 2. $V_T$ is seen to be made up of two components $V_C$ and $V_R$. Phase angle P may equal or exceed 85°. This makes accurate measurement of the insulation resistance difficult, for if the gain of amplifier 110 is increased to increase its sensitivity to the in-phase voltage $V_R$ the amplifier is likely to saturate on the component $V_C$. Vector $V_C (I_C)$ is not useful in determining the insulation or leakage resistance. Thus, elimination of $V_C$ is desirable.

To accomplish that end, a portion of oscillator voltage V is taken through variable transformer 106, which may be a conventional auto-transformer, and an R-C phase shifting network 108 to produce a bucking voltage $V_B$ which leads voltage V by a large phase angle approximating the phase angle of voltage $V_C$ plus 180°. This bucking voltage $V_B$ is added to $V_T$ at the input to filter 104 and substantially cancels out $V_C$, leaving the desired component $V_R$ to pass through filter 104 and the stages of the measuring apparatus which follow filter 104. Filter 104 permits signals at the frequency, $F_2$, of measuring voltage V to pass to amplifier 110 but rejects or by-passes currents at the fundamental transmission-line frequency $F_1$. Filter 104 may be inserted ahead of the injection point for the output $V_B$ of phase shifter 108. Filter 104 is a high-cut, low pass filter the design for which may be obtained from any standard electrical engineering handbook.

Amplifier 110 raises the level of the output signal from filter 104 which signal, at this point, is primarily made up of $V_R$. For impedance matching purposes transformer 116 may be inserted between amplifier 110 and multiplier 118. Multiplier 118 may be any one of the various brands of operational amplifiers having a multiplying function. The output signal appearing at terminals 120 and 122 is the product of the input signals applied to input terminals 124, 126 and 128, 130, respectively.

The signal applied to input terminals 128 and 130 of multiplier 118, if the bucking action of $V_B$ is ignored, as by joining points 100 and 102 and removing phase shifter 108 from the circuit, or if bucking voltage $V_B$ is not totally effective, is representative of the distributed capacitance current $I_C$ and the insulation resistance current $I_R$ which make up the total current at the frequency of oscillator 68.

The instantaneous voltage $V_P$ produced between terminals 20 and 26, 22 and 28, and 24 and 30 by oscillator 68, ignoring any action of transformer 18, is:

$$V_P = \sqrt{2}\, V \sin wt,$$

where w is $2\pi$ times the chosen frequency of oscillator 68.

The current $I_T$ which flows as a result of $V_P$ is:

$$I_T = \sqrt{2}/R\, V \sin wt + \sqrt{2}\, V wC \cos wt,$$

where R is the insulation resistance and C is the distributed capacitance of the transmission system. A corresponding current $KI_T$ flows in secondary 32 and, consequently, through resistor 60.

If the voltage $V_P$ is multiplied by the current $KI_T$ the following product occurs, ignoring constants:

$$V_P \times I_T = V^2/R - (V^2/R \cos 2wt - wcV^2 \sin 2wt)\ldots$$

The term $V^2/R$ is the d.c. component of the output signal at terminals 120 and 122 of multiplier 118. As can be seen from the foregoing equation, that d.c. component is inversely proportional to the parameter to be measured, namely the insulation resistance R.

It is apparent from this equation that the oscillator 68 must have a constant voltage output, once the apparatus is calibrated, to assure accuracy of the insulation or leakage resistance measurement. That voltage is applied to terminals 124, 126, through a transformer, if desired.

A d.c. amplifier 112 amplifies the d.c. component at output terminals 120 and 122 of multiplier 118 and supplies it to meter 114. Meter 114 may be calibrated directly in ohms of insulation resistance.

Operating power is provided from transformer 92 for power supply 150, which supplies appropriate d.c. operating voltages to oscillator 68, amplifier 110, multiplier 42 and amplifier 112 through buses 152, 154, 156, 158, and 160, respectively.

In actual operation, it may be desirable to use, for the introduction of the measuring voltage from oscillator 68 into power lines 10, 12, and 14 the circuit modification shown in FIG. 3. The remainder of the circuit may be identical with that of FIG. 1.

In FIG. 3 the measuring voltage V is introduced in parallel with secondary 32 of transformer 18. This configuration necessitates the use of a low-pass, high-cut filter, of the L-C variety, in series with secondary 50 of transformer 46. Filter 162 is one which exhibits low impedance at frequency $F_1$ and high impedance at $F_2$, permitting both the fault alarm and measuring functions to be performed.

While a particular embodiment of this invention has been shown and described it will be obvious to those skilled in the art that variations may be made without departing from the spirit or scope of this invention. It is the intention of the appended claims to cover all such variations.

What is claimed is:

1. In an ungrounded, three-phase a.c. transmission line system operating at a first frequency and having a grounding transformer with its "Y"-connected primary connected to respective lines representing the separate phases of said three-phase system, its neutral connection grounded and with an open-delta secondary, the method of measuring the insulation resistance of the lines of said transmission line system which includes the steps of:

applying across said open delta secondary an a.c. measuring voltage at a second frequency substantially below said first frequency;
   producing a voltage representative of the current at said second frequency flowing in phase with said a.c. measuring voltage in said open delta secondary as a result of the application of said a.c. measuring voltage to said secondary; and,
   multiplying a voltage representative of said a.c. measuring voltage by said voltage representative of said current at said second frequency in phase with said a.c. measuring voltage to give a product voltage representative of said insulation resistance.

2. The method according to claim 1 which includes the additional step of displaying the product voltage as a resistance measurement.

3. Apparatus for measuring insulation resistance in an ungrounded, a.c., three-phase transmission line system operating at a first frequency, which includes:
   a transformer having primary and secondary windings, said primary winding including first, second and third coils connected in star configuration with each such coil having one end connected to a common junction which is grounded, the remaining end of each coil being connected to a respective one of the transmission lines in said system;
   said secondary winding having first, second and third secondary coils connected in open-delta configuration whereby there are first and second secondary coil ends each not directly connected to another secondary coil end;
   a voltage source coupled across said first and second secondary coil ends for injecting into said transmission line system a measuring voltage at a second frequency substantially lower than said first frequency;
   signal pick-up means coupled to said secondary coils for producing in said pick-up means a detected voltage representative of the current flowing to ground in said transmission line system at said second frequency and in phase with said measuring voltage;
   multiplier means coupled to said voltage source and to said pick-up means for producing a product signal representative of said insulation resistance from said detected voltage and the voltage from said voltage sources; and,
   utility means for utilizing said product signal.

4. Apparatus according to claim 3 in which said signal pick-up means includes quadrature-voltage cancellation means for eliminating from said detected voltage components representative of capacitive currents flowing in said transmission line system at said second frequency.

5. Apparatus according to claim 3 in which said second frequency is approximately one-sixth said first frequency.

6. Apparatus according to claim 3 which includes, in addition, fault alarm means coupled to said secondary winding.

7. Apparatus according to claim 3 which includes, in addition low-pass filtering means coupled between said pick-up means and said multiplier means for isolating said multiplier means from voltages at said first frequency.

8. Apparatus according to claim 3 in which said voltage source is a constant voltage source.

* * * * *